FREQUENCY TO DIGITAL CONVERSIONS
Filed March 20, 1967
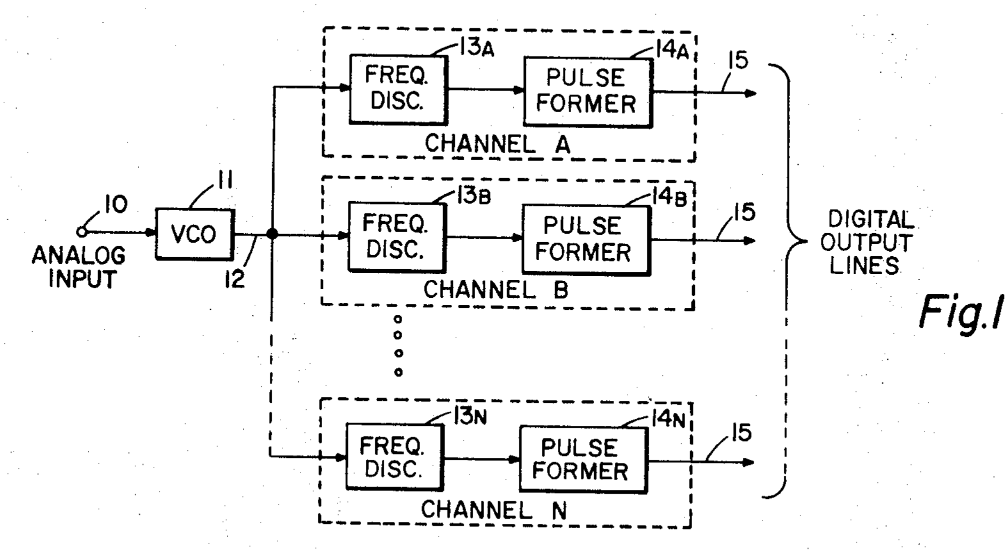
Fig.1
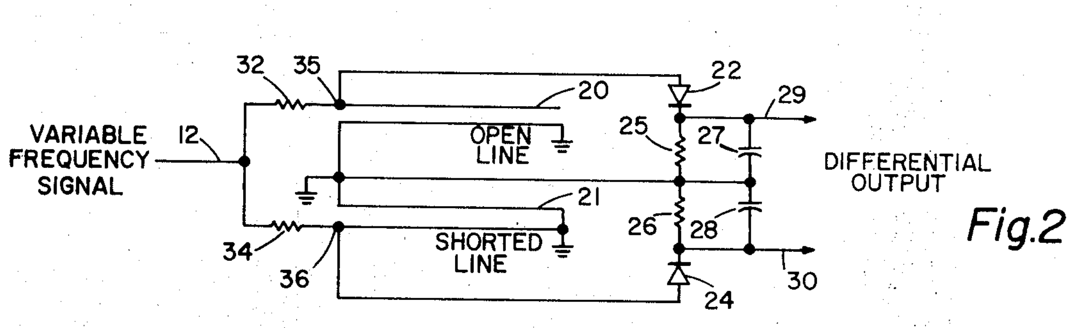
Fig.2
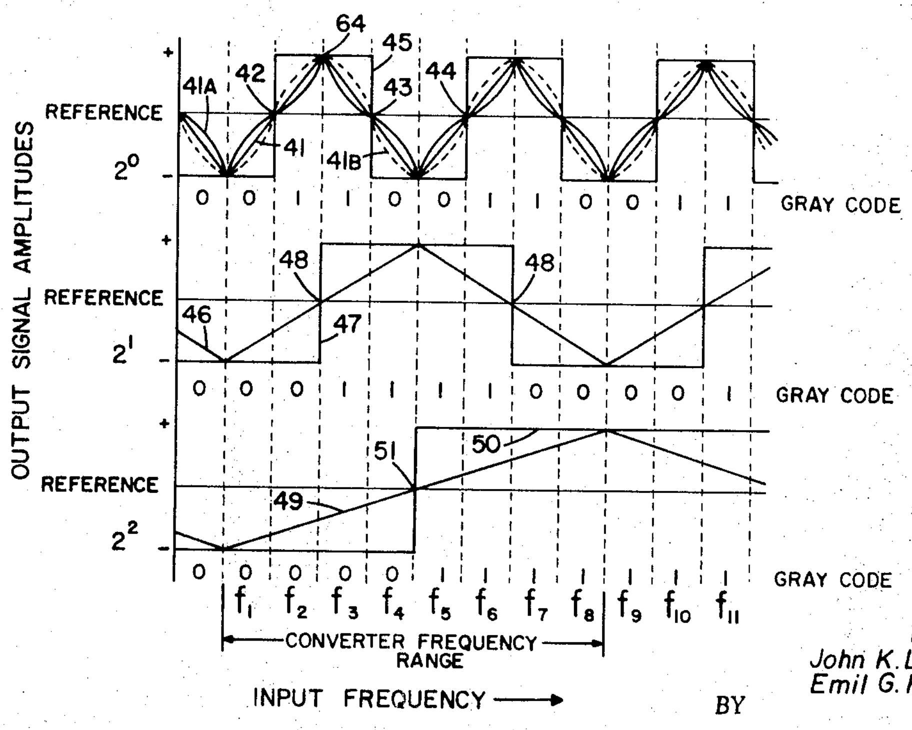
Fig.3A
Fig.3B
Fig.3N
INVENTORS
John K. Lauchner
Emil G. Rupprecht
BY
Mueller, Aichele & Rauner
ATTY'S.

United States Patent Office 3,533,101
Patented Oct. 6, 1970

3,533,101

FREQUENCY TO DIGITAL CONVERSIONS

John Keith Lauchner, Phoenix, and Emil George Rupprecht, Scottsdale, Ariz., assignors to Motorola, Inc., Franklin Park, Ill., a corporation of Illinois Filed Mar. 20, 1967, Ser. No. 624,371
Int. Cl. H03k *13/02*
U.S. Cl. 340—347 7 Claims

ABSTRACT OF THE DISCLOSURE

A plurality of wideband FM line discriminators receive a frequency varying signal. Each discriminator supplies an output signal that varies in amplitude according to the variations in the input frequency with the output signal reversing polarity once every given increment in frequency determined by the electrical length of the lines in the discriminators. The line electrical lengths in the various discriminators are related to each other by the powers of two and arranged to supply a binary Gray coded digital output signal indicative of frequency changes.

BACKGROUND OF THE INVENTION

This invention relates to analog to digital converters especially for wide band conversions utilizing frequency variations of a signal to indicate analog quantities.

Many communication systems and other devices utilize variations in frequency to translate information from one point to another. At a local station it is often desirable that information be represented in a digital or pulse form. Therefore, at a receiver a frequency-to-digital converter is required to convert the frequency variations into digital signals. Such applications include wide band data transfer or communication systems, electronic counter measure systems, fusing systems, connecting microwave signals to digital signals and as a spectrum analyzer.

In high speed wide band analog to digital converters the digital outputs are often formed with counting devices. When a straight binary counter is used there is a problem of high speed carries or borrows and the resultant propagation times through the counter stages. Also, the probability of unwanted transient signals being introduced into the system in a straight binary operation is greater than when a Gray code system is used. In the Gray code system, during a counting operation only one digit position is changed in any given time eliminating all carries.

It is also desired that such analog to digital converters operate in the microwave spectrum; that is, the L-band or higher. Such a system can convert received pulse signals in a wide open search receiver directly to a digital data signal for transmission over a relay link with a minimum of circuitry and a maximum speed. Converters should be of small size with a minimum of components.

SUMMARY OF THE INVENTION

It is an object of the present invention to provide a simple wide-band frequency-to-digital signal converter.

It is another object of this invention to provide a wide-band frequency-to-digital connector having a plurality of independently operating channels supplying parallel digital output signals.

It is a further object of this invention to provide a wide-band frequency variation to digital signal converter which converts into a Gray code in an unambiguous manner over a selected frequency range.

Apparatus utilizing this invention includes a feature of a plurality of frequency discriminators each of which supply output signals which vary in amplitude according to the frequency of the input signal. Each discriminator causes a polarity reversal of its output signal for a given frequency change or increment. The frequency width of the given increment may vary between adjacent discriminators, preferably by a power of two, to provide a binary relationship in the output signals. The responses of the discriminators may be such that a Gray code set of digital signals are automatically and directly supplied by the converter.

A wide-band FM frequency discriminator usable with the present invention is described by C. W. Lee and W. Y. Seo in correspondence entitled "Super Wide-Band FM Line Discriminator," Proceedings of the IRE, volume 51, No. 11, November 1963, pages 1675 and 1676.

BRIEF DESCRIPTION OF THE DRAWING

FIG. 1 is a block diagram of a voltage to Gray code digital signal converter utilizing the teachings of the present invention.

FIG. 2 is a frequency discriminator usable in the FIG. 1 embodiment and incorporating open circuit and short circuit transmission lines combined to form the frequency discriminating characteristics.

FIGS. 3*a*, 3*b*, and 3*n*, show wave forms and related binary information represented in a simplified but exemplary operation of the FIG. 1 system.

DESCRIPTION OF AN ILLUSTRATIVE EMBODIMENT

Referring now to FIG. 1, an analog voltage-variable input signal is supplied through terminal 10 to voltage controlled oscillator (VCO) 11. It is known that oscillator 11 varies its output frequency according to the variations in input voltage to supply a frequency varying signal over line 11. It is desired that VCO 11 be broad band and quickly responsive to changes in voltage on terminal 10. Alternatively, an FM signal is supplied to the later described converter over line 12.

The expected variations in frequenuy of the signal on line 12 may be quantized into as many digital units as desired. In the FGI. 1 embodiment there are shown three channels A, B, and N respectively consisting of frequency discriminators 13A, 13B, 13N and pulse formers 14A, 14B and 14N. The frequency discriminators or converters employed in the present invention are characterized in operation by the fact that the amplitude of the output signal varies periodically in accordance with the frequency of the input signal. Thus, the polarity of the output signal of each frequency discriminator changes when the frequency of the input signal has traversed a predetermined frequency range or increment. The change in frequency of the input signal required to effect a polarity change in the output signal is determined by the design characteristics of each discriminator. The pulse former circuit associated with each frequency discriminator is responsive to the changes in polarity of the discriminator output signal and performs a wave shaping operation to convert the variable amplitude discriminator signal into a digital waveform. The series of discriminator-pulse former combinations provide a coded digital output signal in accordance with the coding of the frequency increment of each discriminator. The Gray coded digital output signal is supplied over output lines 15 to digital data handling, processing or interpreting devices (not shown). In the FIG. 1 embodiment channel A corresponds to the $2^0$ digit position; therefore, frequency discriminator 13A provides a polarity reversal in its output signal on the smallest increment of frequency variation. For example, in one embodiment, wherein 3 discriminators were utilized, the approximate frequency range used was 0.96 gHz. to 1.90 gHz. There were $2^3$ narrowest frequency increments of 117 mHz. such increments being uniform throughout the range. The $2^0$ channel then reversed polarity $(2^{3-1})$ times in each frequency excursion covering the entire range.

Channel B including discriminator 13B and pulse former 14B in the above referred to embodiment supplied an output signal having a polarity reversal every 234 mHz. or twice the frequency increment of channel A, to form the $2^1$ digit position. Other discriminators caused polarity reversals in their respective output signals at increasingly greater frequency increments according to the powers of two.

The selection of the range and the frequency increment for a particular discriminator is a matter of design choice. An important consideration in designing analog to digital converters using these techniques is the frequencies at which the output signal polarity reversals occur, as will become apparent from the following description.

Referring now to FIG. 2 there is shown in schematic form a frequency discriminator usable as discriminators 13A, 13B and 13N of FIG. 1. Input line 12 may include an isolating RF amplifier (not shown) supplying the input signal through bridge input resistors 32 and 34. The characteristic impedance of the resistors 32 and 34 should be $\sqrt{2}$ times the characteristic impedances of the lines, although variations are permissible. For example, in one embodiment utilized in testing the FIGS. 1 and 2 configurations, resistors 32 and 34 should have had an impedance $\sqrt{2}\times 50$ or 70.7 ohms. In conducting tests thereon, 68 ohm carbon resistors were used and the device successfully operated within a 4 percent accuracy. The tests were conducted in the range above cited with a band spread or frequency increment of 117 mHz. between polarity reversals of the lowest ordered binary digital channel (channel A—$2^0$ digit position).

The input signals are supplied from resistor 32 to open circuit transmission line 20 and from resistor 34 to short circuit transmission line 21. The lines 20 and 21 and input connections 35 and 36 are also connected to the output detector diodes 22 and 24. Resistors 25 and 26 and capacitors 27 and 28 form an output signal network which in the FIG. 1 embodiment is preferably designed to provide a maximum voltage potential build-up. In FIG. 1, pulse formers 14A, 14B and 14C are voltage responsive devices, such as differential amplifiers which are operated in the saturation region to form pulse type output digital signals. As used above, the term "pulse" means any signal having two amplitude states (high and low) and which changes states rapidly with respect to other changes within the system or apparatus it operates with. There are many devices usable to convert the amplitude varying discriminator signals to such pulse form. No limitation to any particular class of pulse formers is intended.

In describing the operation of FIG. 2 it is best to use a mathematical expression defining the circuit impedances as such impedances vary with the frequency of the input signal to form the amplitude varying output signals. The voltage at junction 35, the input to line 20 (the open circuited line), is determined by voltage divider operation of resistor 32 and the impedance of line 20 as measured between input line 12 and ground reference potential and is given by the following equation:

$$e_{20}=e_{12}\left[\frac{Z_{20}}{\gamma Z_0+Z_{20}}\right] \qquad (1)$$

Where $e_{20}$ is the voltage at junction 35, $e_{12}$ is the voltage on line 12, $Z_{20}$ is the electrical impedance of line 20, $\gamma$ is the coupling resistance constant, and $Z_0$ is the characteristic impedance of line 20. The coupling resistance constant may be determined according to the techniques described by Choong Woong Lee in "An Analysis of Super-Wide Band FM Line Discriminator," Proceedings of the IRE, volume 52, September 1964, page 1034 et seq. The term $\gamma Z_0$ is the resistance of a resistor 32.

When the leakage of line 20 is insignificant, the instantaneous electrical impedance of line 20 is given by the equation below:

$$Z_{20}=-jZ_0 \cot\theta \qquad (2)$$

Where $j$ indicates that the impedance is entirely reactive, $\theta$ is the instantaneous phase of the input signal on line 12 and is given by:

$$\theta=2\pi l/\lambda \qquad (3)$$

Where $2\pi$ is the angular measurement per cycle of the input signal, $l$ is the electrical length of the line and $\lambda$ is the wavelength of the input signal.

Substituting Equation 2 into Equation 1 we obtain:

$$e_{20}=e_{12}\left[\frac{-jZ_0\cot\theta}{\gamma Z_0-jZ_0\cot\theta}\right] \qquad (4)$$

Simplifying the above equation the following is obtained:

$$e_{20}=\frac{e_{12}}{\dfrac{\gamma Z_0}{-jZ_0\cot\theta}+1} \qquad (5)$$

$$=\frac{e_{12}}{1+j\gamma\tan\theta} \qquad (6)$$

The rectified output voltage with respect to ground reference potential on line 29 is approximated below:

$$e_{29}\approx e_{20}=\frac{|e_{12}|}{|1+j\gamma\tan\theta|} \qquad (7)$$

Simplifying:

$$=\frac{|e_{12}|}{\sqrt{1+\gamma^2\tan^2\theta}} \qquad (8)$$

A similar set of equations showing the impedances and resultant output voltages for the shorted line side of the discriminator is obtained when the voltage at junction 36 is given by:

$$e_{21}=e_{12}\frac{Z_{21}}{Z_0+Z_{21}} \qquad (9)$$

Substituting as in the equation for line 20 we obtain:

$$e_{21}=e_{12}\frac{jZ_0\tan\theta}{Z_0+jZ_0\tan\theta} \qquad (10)$$

$$=\frac{e_{12}}{1-j\gamma\cot\theta} \qquad (11)$$

The output voltage on line 30 with respect to ground reference potential is given by:

$$e_{30}\approx e_{21}=\frac{|e_{12}|}{|1-j\gamma\cot\theta|} \qquad (12)$$

$$=\frac{|e_{12}|}{\sqrt{1+\gamma^2\cot^2\theta}} \qquad (13)$$

The double-ended output voltage between lines 29 and 30 is given by the difference between the voltages represented by Equations 8 and 13.

From examination of the equations it is seen that a periodic function of voltage amplitude is provided which is related to changes in input frequency; i.e., the term $\theta$ in the Equations 8 and 13 through the variations in line electrical impedances. The output signal voltage variations with respect to corresponding variations in the input signal frequency in line 12 is best understood with reference to FIG. 3A wherein triangular shaped wave 41B represents an idealized variation of output signal voltage with respect to frequency. The frequency bands $f_1$ through $f_{11}$, inclusive, represents the equal increments of frequency in a given frequency range of converter or discriminator operation. The actual waveform of the output signal voltages will vary according to the selection of $\gamma$. When $\gamma$ is made equal to $\sqrt{2}$, that is the resistance of resistors 32 and 34 equal $\sqrt{2}$ times the characteristic impedance of lines 20 and 21, the idealized wave 41B is closely approximated. In actual practice there are deviations from the idealized wave as is exemplified by waves 41 and 41A. Further, when resistors 32 and 34 are made different from $\sqrt{2}$ times the characteristic impedance, the greater the difference, the greater the deviation of wave 41A from idealized wave 41B. It has been found that the zero axis crossings, that is, the polarity reversals, always occur at the same point in frequency; that is, the polarity reversals at points 42, 43 and 44 will be the same even though the resistance values of resistors 32 and 34 are different than the characteristic impedance, $Z_0$.

It should be noted that lines 20 and 21 should have the same electrical length. By changing both lines simultaneously an equal length, it can be seen from Equations 3 and the Equations 8 and 13, the number of polarity reversals or zero axis crossings in the output signal between lines 29 and 30 will change for the same frequency variation. For a given change in frequency, the longer the line, the more numerous the polarity reversals in the output signal.

The FIG. 1 converter utilizes the above characteristics in forming a frequency change to binary digital converter in that the relationship of the lengths of the lines in the various frequency discriminators 13A, 13B and so forth through 13N are varied according to the powers of two. Assuming there are only three such discriminators in the network, the three waveforms of FIGS. 3A, 3B and 3N represent the output signals of the respective discriminators for providing a three digit position binary output having a $2^0$ digit position for channel A, a $2^1$ digit position for channel B and a $2^2$ output signal digit position for channel N. In so choosing the relationships between the converter channels the output signals can be made to reverse polarities, i.e., have zero axis crossings, according to the well known Gray code, as will be later explained.

Turning to FIG. 3A, signal 41 from frequency discriminator 13A is supplied to pulse former 14A. Pulse former 14A converts wave 41 into rectangular wave 45 which changes states preferably exactly at the zero crossings of triangular wave 41, although this action is not necessary to successfully utilize this invention. The changes of state or polarity reversals of wave 45 of the various channels have to be coordinated such that the frequency relationships are maintained, that is, the polarity reversal of wave 45 must have a given relationship to other square waves in the other channels that is substantially identical to the relationship of the zero axis crossings of the triangular waves supplied by the respective channel frequency discriminators. Rectangular wave 45 constitutes the digital output signal of channel A.

In a similar manner triangular wave 46 of channel B shown in FIG. 3B is supplied to pulse former 14B which converts it into rectangular wave or digital signal 47. Triangular wave 46 has one-half of the frequency of triangular wave 41 and correspondingly, digital signal 47 is at one-half the frequency of digital signal 45. It should also be noted that the zero axis crossings 48 of signals 46 and 47 (FIG. 3B) are midway between the zero axis crossings 42 and 43 (FIG. 3A) of signals 41 and 45. Similarly, triangular wave 49 (FIG. 3N) supplied from discriminator 13N to pulse former 14N provides a digital signal 50 having exactly one-half the frequency of digital signal 47 with its zero axis crossing 51 at the midpoint between the corresponding zero axis crossings 48 of signals 46 and 47 (FIG. 3B). Also, zero axis crossing 51 occurs midway between zero axis crossings 43 and 44 (FIG. 3A) of signals 41 and 45. As additional channels are added to the FIG. 1 converter, the polarity reversals or zero axis crossing of the signals supplied from the respective frequency discriminators and the resulting digital output signal are intermediate the zero axis crossings of all other supplied output signals. Such characteristic is utilized to represent digital information in the form of a Gray code.

The Gray code representation of the digital signals in FIGS. 3A, 3B, and 3N are indicated immediately below the respective waveforms. In this illustration, a positive polarity digital signal is arbitrarily selected as indicating a binary one while a negative polarity signal represents a binary zero. In proceeding from the left side of the three FIGS. 3A through 3N, toward the right, it is seen that there is a count from a maximum all zeros (increment $f_1$) to a maximum count if seven for three digit positions in increment $f_8$. Examination of the representative information indicates that only one digit position, that is, one output digital signal, changes at any given instant, a characteristic of the Gray code. It is appreciated that for an unambiguous frequency indication by the digital signals the total range of frequency variations must be representable by the digit positions provided. Such is not shown in this particular instance since the frequency variations illustrated in FIGS. 3A, 3B and 3N include more than eight increments of frequency $f_1$ through $f_{11}$. In this illustration, to unambiguously indicate frequency, four channels would be required.

It may be noted that the Gray code representation provided by a frequency excursion encompassing a plurality of unambiguously indicatable frequency ranges ($f_1$–$f_8$, for example) repeats in alternating reversing order, i.e., counts down to zero and then begins to count up toward a maximum count.

In going to an adjacent range of frequencies the count of the last frequency increment in one range is carried into the first or immediately adjacent frequency increment of the adjacent range, such as increments $f_8$ and $f_9$ in FIGS. 3A–N. Such action is necessary to provide a full scale Gray code count in each range of frequencies.

We claim:

1. Apparatus for converting a frequency modulated input signal into a coded digital output signal which comprises:

(a) input means for receiving the frequency modulated input signal;

(b) a plurality of channels each of which is coupled to said input means, each said channel including (i) a frequency discriminator for generating a periodic output signal which varies in amplitude and polarity according to the frequency of the input signal, each discriminator providing a polarity reversal of its output signal for incremental changes in frequency of the input signal, the incremental changes in input signal frequency causing a polarity reversal in output signals of the different discriminators being coded in accordance with a particular code for the digital output signal, and (ii) pulse forming means coupled to the output of the frequency discriminators for generating a digital signal in response to a polarity change in the output signals of the discriminators, (iii) the incremental changes in frequency required to effect polarity reversals of the output signals of said discriminators being fixed so that the polarity reversal of each discriminator is intermediate the polarity reversals of the remaining discriminators, the output of said pulse forming means being a coded digital signal.

2. Apparatus in accordance with claim 1 wherein the frequency increments of said discriminators which determine the polarity reversals of the discriminator output signals vary in magnitude according to the power of an integral number.

3. Apparatus in accordance with claim 2 wherein said frequency discriminators are each characterized by a pair of transmission lines having equal lengths and characteristic impedances, one end of each of said lines being coupled to said input means, one of said lines being terminated in a short circuit, the other of said pair of lines being terminated in an open circuit, each of said discriminators further including means for coupling the pulse forming means to the ends of the transmission line pairs which are coupled to said input means.

4. Apparatus for converting a frequency varying input signal into a coded digital output signal, said apparatus comprising:

(a) a first input terminal to which the frequency varying input signal is applied;

(b) a plurality of frequency to amplitude converters, each having an input and an output terminal, the input terminal of each of said converters being coupled to said first input terminal, each of said converters generating a periodic amplitude varying output signal in response to the frequency varying input signal, the output signal of each of said converters changing polarity each time the frequency of said input signal changes by a predetermined increment; and (c) pulse forming means coupled to the output terminal of each of said converters, said pulse forming means being responsive to changes in polarity of the output signal from said converters and generating digital output signals corresponding to the polarity changes, said digital output signal being coded in accordance with the frequency increments of said converters.

5. Apparatus in accordance with claim 4 wherein the frequency increments of said converters vary in magnitude according to the power of an integral number.

6. Apparatus in accordance with claim 4 wherein said pulse forming means includes a plurality of pulse formers having first and second output states, each of said pulse formers being coupled to the output terminal of one of said converters and changing output states in response to a change in polarity of the corresponding converter output signal.

7. Apparatus in accordance with claim 6 wherein the predetermined increments of input signal frequency required to effect a change in polarity of the converter output signals have different bandwidths, the different bandwidths varying by powers of two and being staggered in frequency so that all of the polarity changes in converter output signals occur at different frequencies.

References Cited

UNITED STATES PATENTS

| | | | |
|---|---|---|---|
| 2,941,075 | 6/1960 | Christian | 329—112 |
| 3,160,822 | 12/1964 | Dix | 329—112 |
| 3,215,934 | 11/1965 | Sallen | 324—78 |
| 3,275,938 | 9/1966 | Carsello et al. | 325—349 |
| 3,319,225 | 5/1967 | Anderson et al. | 328—138 |
| 3,445,840 | 5/1969 | Carlstead | 340—347 |

FOREIGN PATENTS

| | | |
|---|---|---|
| 711,762 | 7/1954 | Great Britain. |

MAYNARD R. WILBUR, Primary Examiner

C. D. MILLER, Assistant Examiner

U.S. Cl. X.R.

329—112